United States Patent [19]

Ito et al.

[11] 4,123,781
[45] Oct. 31, 1978

[54] TELEVISION TUNER WITH FINE TUNING MEANS

[75] Inventors: Katsuo Ito; Kazunori Yoshimura, both of Kanazawa, Japan

[73] Assignee: Murata Manufacturing Co., Ltd., Nagaokakyo, Japan

[21] Appl. No.: 777,703

[22] Filed: Mar. 15, 1977

[30] Foreign Application Priority Data

Mar. 15, 1976 [JP] Japan .............................. 51-31540[U]
Mar. 15, 1976 [JP] Japan .............................. 51-31541[U]

[51] Int. Cl.² .......................... H04B 1/26; H03J 1/14
[52] U.S. Cl. .................................... 358/191; 74/10.6; 325/416; 325/452; 334/74
[58] Field of Search ............... 325/416, 452, 457, 417; 358/191; 334/51, 57, 74; 74/10.29, 10.6

[56] References Cited

U.S. PATENT DOCUMENTS 3,495,196  2/1970  Fulton ..................................... 334/51

FOREIGN PATENT DOCUMENTS 99,882  9/1940  Sweden ..................................... 334/74

Primary Examiner—Robert L. Griffin
Assistant Examiner—Marc E. Bookbinder
Attorney, Agent, or Firm—Birch, Stewart, Kolasch and Birch

[57] ABSTRACT

A television tuner including a fine tuning mechanism, said mechanism comprising a cam body provided to a sleeve rotatably disposed around the operating shaft, said cam body having a cam surface adapted to convert rotary motion to reciprocating motion, and fine tuning means including a bobbin having a coil around the outside thereof, and a plunger having at one end a core adapted to be disposed within said bobbin, said plunger being L-shaped and composed of a plunger body provided with a core at one end and an arm portion at the other end, said arm portion being kept in contact with said cam surface at the free end thereof so that the plunger reciprocates said core within said bobbin with the rotation of said sleeve.

3 Claims, 6 Drawing Figures

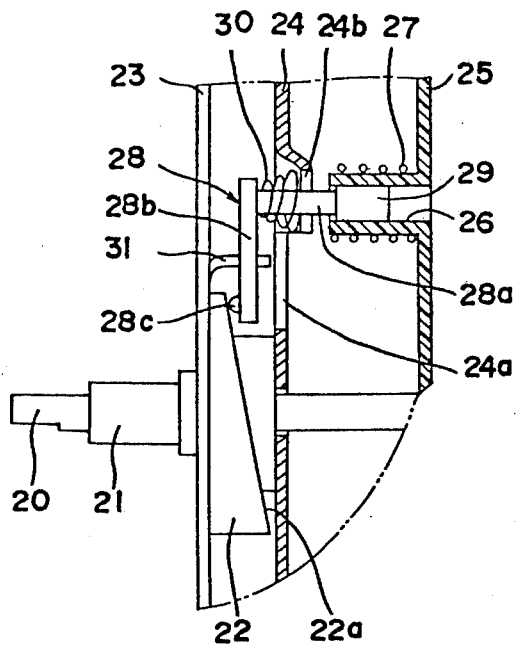
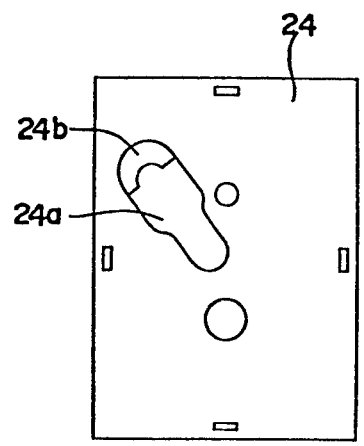
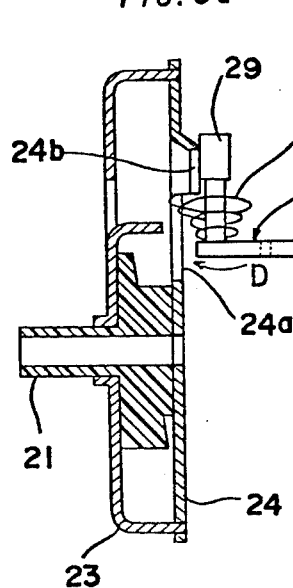
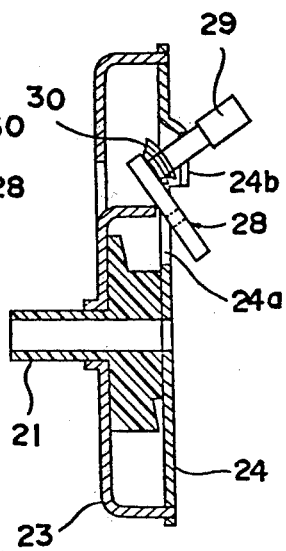
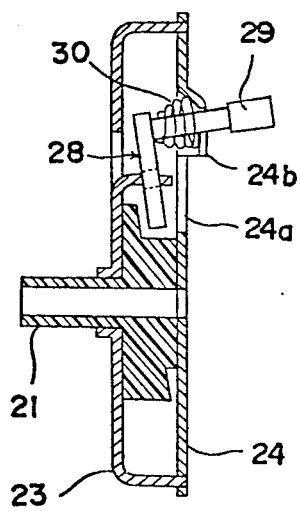

TELEVISION TUNER WITH FINE TUNING MEANS

BACKGROUND OF THE INVENTION

1. Field of the Invention

This invention relates to a television tuner with fine tuning means and, more particularly, to a mechanism for operating fine tuning means in television tuners.

2. Description of the Prior Art

Conventionally, in television tuners having an operating shaft for channel salection, there has been provided fine tuning means including a bobbin having a coil around the outside thereof, and a plunger having at one end a ferromagnetic core. In order to effect fine tuning, it is essintial that the core is moved to a desired position within the bobbin so that the inductance of coil is varied. Such fine tuning means is generally operated by a mechanism comprising a sleeve rotatably disposed around the operating shaft, and a cam adapted to move the plunger axially with the rotation of the sleeve. However, the conventional mechanism for operating fine tuning means is very complicated in construction since the cam is driven through power transmission means such as, for example, a pair of gears. Because of the complex construction, the mechanism wears and the parts are reduced in size after prolonged use, resulting in the dislocation of the parts. Further, the conventional mechanism has the disadvantage that the core may be shifted from the desired position when any mechanical shock is applied to the tuner.

SUMMARY OF THE INVENTION

It is therefore an object of the present invention to provide an improved mechanism for operating fine tuning means which is simple in construction and easy to assemble.

Another object of the present invention is to provide an improved mechanism for operating fine tuning means which makes it possible to prevent the dislocation of the parts and the shift of the core.

A further object of the present invention is to provide an improved mechanism for operating fine tuning means which can be manufactured with a minimum number of movable parts without any reduction in performance and with an improved durability.

According to the present invention, there is provided a mechanism for operating fine tuning means particularly for use in a television tuner including an operating shaft for channel selection, which comprises a cam body provided to a sleeve rotatably disposed around the operating shaft, said cam body having a cam surface adapted to convert rotary motion to reciprocating motion, and fine tuning means including a bobbin having a coil around the outside thereof, and a plunger having at one end a core adapted to be disposed within said bobbin, said plunger being of L-shaped and composed on a plunger body provided with a core at one end and an arm portion at the other end, said arm portion being kept in contact with said cam surface at the free end thereof so that the plunger reciprocates said core within said bobbin with the rotation of said sleeve.

Other objects and further scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will be further understood from the following description taken in conjunction with preferred embodiments thereof shown in the accompanying drawings, in which:

FIG. 4 is a partial sectional view, on an enlarged scale, of the fine tuning mechanism in another embodiment of the present invention;

FIG. 5 is a plan view of the auxiliary plate in the embodiment shown in FIG. 4; and FIG. 6 is a view showing procedures for the assembly of the plunger in the embodiment shown in FIG. 4.

DETAILED DESCRIPTION OF THE INVENTION

As is well known, television tuners may be of the continuous type, the turret type or the switch type. For convenience sake, a tuner of the switch type is illustrated here, but it is to be understood that the invention may be applied to other kinds of tuners. The switch type has a number of switch sections each being provided with suitable circuit components. Each switch section has a stator and rotor, and tuning is accomplished by turning the operating shaft together with rotors of respective switch sections to change electrical connections.

Figure 1:
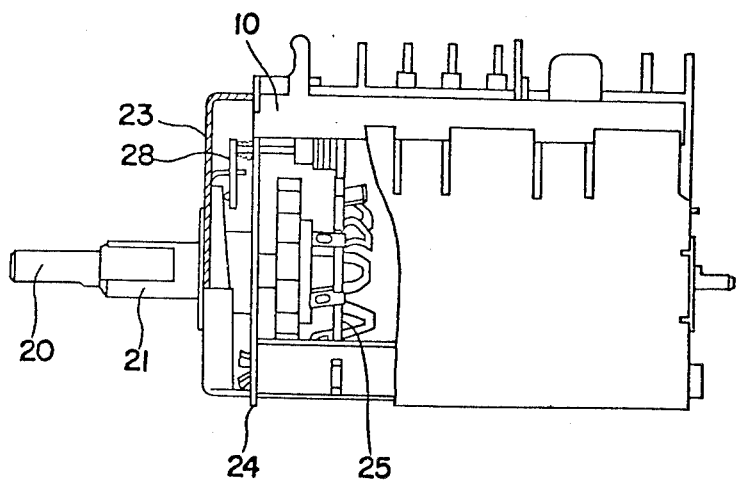
FIG. 1 is a schematic side elevation, partially cutaway, of a television tuner with fine tuning means according to the present invention.
Figure 2:
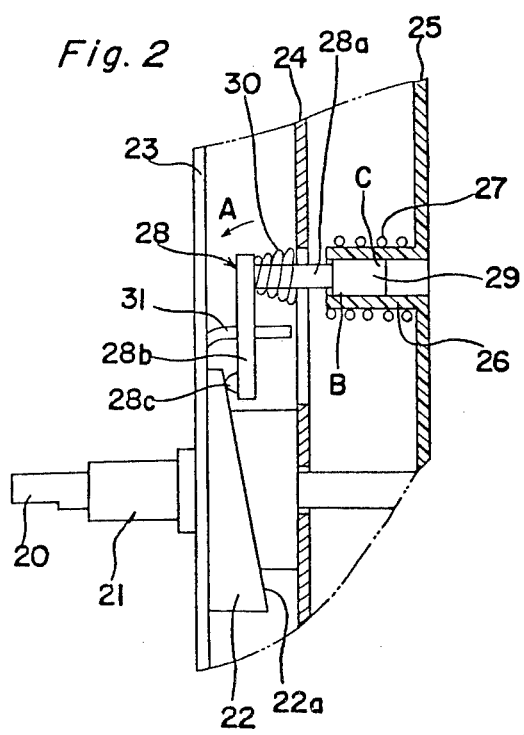
FIG. 2 is a partial sectional view, on an enlarged scale of the fine tuning mechanism shown in FIG. 1.
Figure 3:
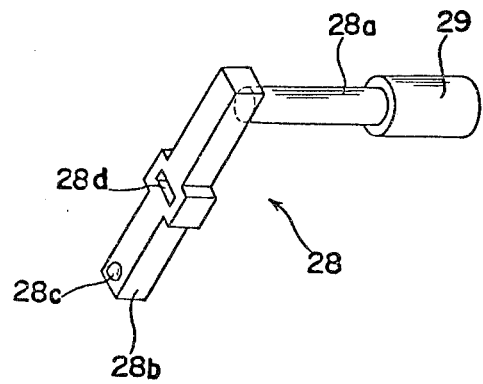
FIG. 3 is a perspective view of the plunger in the fine tuning mechanism shown in FIG. 2.

Referring now to FIGS. 1 to 3, there is shown a television tuner of the switch type embodying the present invention which comprises a housing 10 provided with a front plate 23, an auxiliary plate 24 and a rear plate. The housing 10 is surrounded with a cover shielding from all sides. Rotatably secured in the rear plate and the auxiliary plate 24 is an operating shaft 20 for the channel selection of the tuner, which is provided with the rotors of switch sections. Such a tuner may have a number of switch sections of which one is illustrated here. The section 25 comprises a stator carrying suitable coils and includes a rotor carrying suitable contacts for cooperation with stator contacts to switch the various coils into or out of circuit as desired.

Rotatably disposed around the operating shaft 20 is a sleeve 21 which is provided with a cam body 22 at one end thereof. The cam body 22 is disposed rotatably between the front plate 23 and auxiliary plate 24. The sleeve 21 and cam body 22 may be formed separately or in one united body with a suitable synthetic resin. The cam body 22 is provided with a cam surface 22a adapted to convert the rotating motion to reciprocating motion. The section 25 is provided with fine tuning means including a L-shaped plunger 28 and a cylindrical bobbin 26 having a coil 27 around the outside thereof. The cylindrical bobbin 26 is disposed in the direction parallel to the axis of the sleeve 21, and the coil 27 may be connected to the intermediate frequency oscillator circuit of the tuner. The section 25 and the bobbin 26 may be formed in a body. As best seen from FIG. 3, the L-shaped plunger 28 consists of a plunger body 28a and an arm portion 28b provided to one end of the plunger body 28a at right angle thereto. A projection 28c is provided at the free end of the arm portion 28b and on the opposite side thereof from the plunger body 28a. This projection 28b provides a cam follower surface for cooperation with cam body 22. The contact between the plunger 28 and the cam surface 22a may be effected by the use of any other construction without use of the projection. Fixed to the other end of the plunger body 28a is a core 29 which is slidably disposed within the bobbin 26 and moved into or out of the coil 27 to vary the inductance of the coil. The plunger 28 is arranged in such a manner that the core 29 is disposed within the bobbin 26 and the projection 28c is kept in contact with the cam surface 22a of the cam body 22. In order to bias the plunger 28 to one extreme position, from which the plunger may be moved, a helical spring 30 is loaded between the arm portion 28b of the plunger 28 and the auxiliary plate 24. The large end of the spring 30 is disposed against the auxiliary plate 24, while the small end thereof is against the arm portion 28b. The spring 30 provides the force for turning the plunger 28 around the projection which acts as a fulcrum in the direction indicated by an arrow A, so that the core 29 is brought into contact with at least two portions of the inner wall of the bobbin, indicated by the symbols B and C. For this reason, the core is prevented from shifting even when a mechanical shock is applied to the tuner, thus making it possible to prevent the change of the inductance of coil 27 which has a bad influence on an image of the television receiver.

In order to smooth the movement of the plunger 28, a guide 31 is provided on the front plate 23 by cutting and raising up a portion of the front plate, and is inserted into a slit or hole 28d provided in approximately the center of the arm portion 28b of the plunger 28. As a guide means, there may be provided a spaced pair of guide strips each of which is adapted to be in contact with the opposite side of the arm portion 28b. In this embodiment, the arm portion may be provided with a pair of recesses or projections on both sides thereof.

Referring now to FIGS. 4 to 6, there is shown another embodiment of the present invention in which the fine tuning mechanism, its individual parts and functions are the same as described above with respect to FIGS. 1 to 3, except that the auxiliary plate 24 is provided with an opening 24a for inserting plunger 28 into the position, and a spring supporting portion 24b, as shown in FIG. 5. The supporting portion 24b is depressed in the direction towards the section 25 and formed at a portion adjacent to the opening 24a, but remote from the place with which the cam body 22 is in contact. In this embodiment, the plunger 28 is assembled in the following manner.

As shown in FIG. 6a, the spring 30 is disposed around the plunger body 28a, and then brought into contact with the end of the depressed portion 24b at the large end of the spring under the condition that the arm portion 28b of the plunger 28 runs parallel to the axis of the sleeve 21. After this, as shown in FIG. 6b, the plunger 28 is rotated as a whole in the direction indicated by an arrow D, while the spring 30 is compressed by the plunger 28. During the rotation of the plunger 28, the upper surface of the arm portion 28b is kept in contact with the end of the guide 28d. When the end of the guide 31 is inserted into the hole 31, the plunger 28 is positioned as shown in FIG. 6c. The thus obtained assembly including the front plate 23, auxiliary plate 24, cam body 22 and plunger 28 with spring 30 is fixed to the tuner housing 10 provided with the section 25 so that the core 29 is inserted into the bobbin 26.

As will be understood from the above, the assembly of the plunger is very easy, thus making it possible to reduce the working time required for the assembly of the fine tuning mechanism.

It will be appreciated that it is not intended to limit the invention to the above example only, many variations, such as might readily occur to those skilled in the art, being possible without departing from the scope thereof.

What is claimed is:

1. In a television tuner having fine tuning means comprising:
   the combination of a cam body provided on a sleeve for controlling fine tuning means;
   said cam body having a cam surface adapted to convert rotary motion to reciprocating motion;
   said fine tuning means comprising a bobbin having a coil around the outside thereof and being disposed in a direction parallel to the axis of an operating shaft of said tuner;
   an L-shaped plunger having at one end a core and the other end an arm portion, said core being slidably disposed within said bobbin;
   said arm portion being provided with a slit or hole and kept in contact with said cam surface at the free end thereof so that said arm reciprocates said core within said bobbin with the rotation of said sleeve; and
   guide means for said L-shaped plunger provided on a tuner housing and inserted into said slit or hole in said arm portion.

2. The construction of claim 1, wherein said plunger is biased by a helical spring in such a manner that said plunger is given a force which turns the plunger about a portion where the plunger is in contact with the cam surface.

3. In a television tuner having fine tuning means comprising:
   the combination of a tuner housing provided with a front plate, an auxiliary plate and switch sections disposed between said auxiliary plate and a rear plate;
   a cam body provided on a sleeve for controlling the fine tuning means and rotatably disposed between said front and auxiliary plates;
   said sleeve being rotatably disposed around an operating shaft for channel selection provided on said housing;
   a bobbin having a coil around the outside thereof and being provided on a section disposed on a side of said auxiliary plate;
   an L-shaped plunger having at one end a core and at the other end an arm portion;
   a guide provided on said front plate;
   said auxiliary plate being provided with an opening for inserting said plunger and a spring supporting portion;
   said cam body having a cam surface adapted to convert rotary motion to reciprocating motion;
   said arm portion being kept in contact with said cam surface at the free end thereof;
   said guide being inserted into a hole provided in said arm portion; and
   said L-shaped plunger being biased against the front plate by means of a helical spring disposed around the plunger body and between said arm portion and supporting portion.

* * * * *